United States Patent
Mokhlesi

(10) Patent No.: US 7,799,637 B2
(45) Date of Patent: Sep. 21, 2010

(54) SCALED DIELECTRIC ENABLED BY STACK SIDEWALL PROCESS

(75) Inventor: Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 243 days.

(21) Appl. No.: 11/426,560

(22) Filed: Jun. 26, 2006

(65) Prior Publication Data

US 2007/0298568 A1    Dec. 27, 2007

(51) Int. Cl.
H01L 21/336    (2006.01)

(52) U.S. Cl. ............. 438/261; 438/257; 257/E27.103

(58) Field of Classification Search .......... 438/201, 438/211, 216, 264, 785, 257, 315; 257/314–317
See application file for complete search history.

(56) References Cited

U.S. PATENT DOCUMENTS

| | | | | |
|---|---|---|---|---|
| 6,849,897 B2 * | 2/2005 | Dong et al. | ............ | 257/316 |
| 6,958,503 B2 | 10/2005 | Motoyoshi | | |
| 6,969,650 B2 * | 11/2005 | Yun et al. | ............ | 438/257 |
| 2002/0060332 A1 * | 5/2002 | Ikeda et al. | ............ | 257/298 |
| 2002/0187609 A1 * | 12/2002 | Kim et al. | ............ | 438/257 |
| 2004/0222490 A1 | 11/2004 | Raaijmakers | | |
| 2005/0019494 A1 | 1/2005 | Moghadam | | |
| 2005/0157549 A1 | 7/2005 | Mokhlesi | | |
| 2006/0022252 A1 * | 2/2006 | Doh et al. | ............ | 257/314 |
| 2006/0110880 A1 | 5/2006 | Yuan | | |
| 2006/0240619 A1 * | 10/2006 | Ozawa et al. | ............ | 438/257 |
| 2007/0029625 A1 * | 2/2007 | Lue et al. | ............ | 257/411 |
| 2007/0045718 A1 * | 3/2007 | Bhattacharyya | ............ | 257/324 |
| 2007/0166937 A1 * | 7/2007 | Adetutu et al. | ............ | 438/300 |
| 2008/0153227 A1 * | 6/2008 | Om et al. | ............ | 438/259 |

FOREIGN PATENT DOCUMENTS

EP    1566844    8/2005

* cited by examiner

*Primary Examiner*—Steven Loke
*Assistant Examiner*—David Goodwin
(74) *Attorney, Agent, or Firm*—Vierra Magen Marcus & DeNiro LLP

(57) ABSTRACT

Non-volatile storage elements (or other device) are created. One embodiment includes creating floating gate stacks comprising a floating gate, a control gate and a dielectric between the floating gate and the control gate. One example of a suitable dielectric includes a first layer of oxide, a layer of nitride and a second layer of oxide, all three of which are deposited using Atomic Layer Deposition (or other process). An implant (or other) process is used to create source/drain regions. ALD is used to deposit oxide and nitride for sidewalls.

29 Claims, 16 Drawing Sheets

Fig. 2B
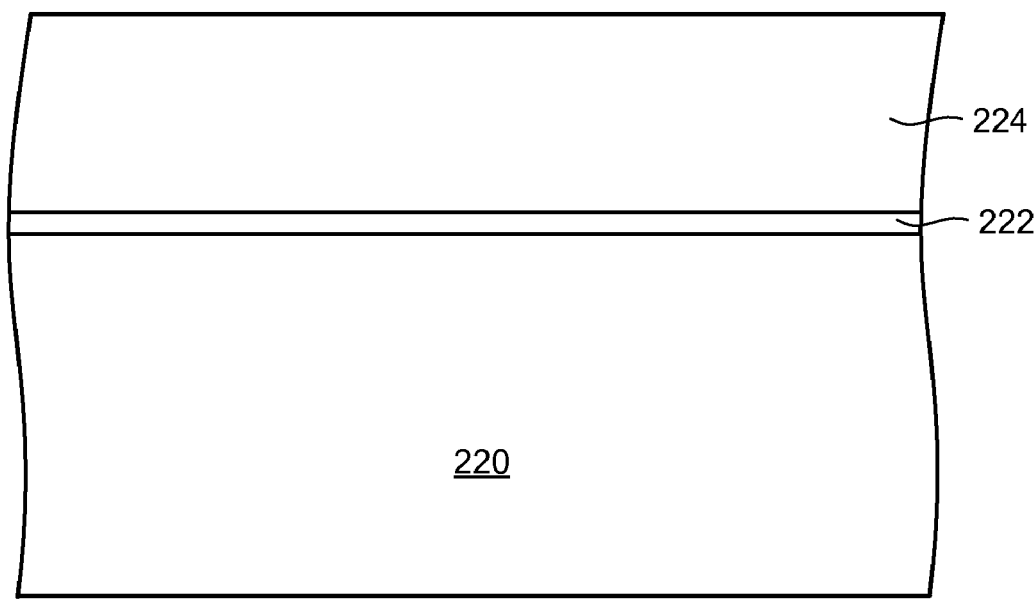
Fig. 2C
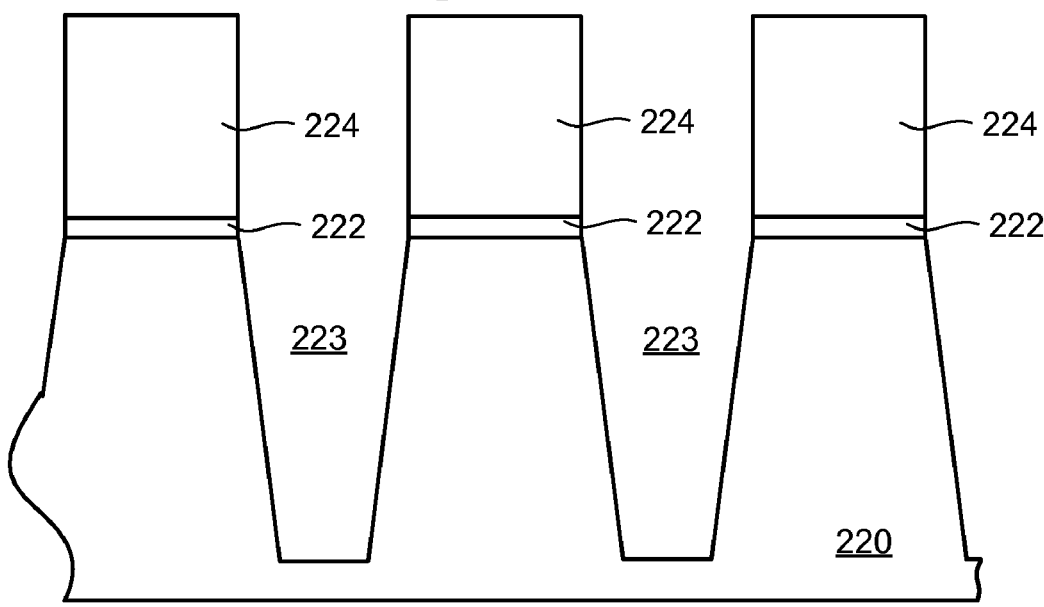
bitline/NAND string direction (in/out of page) 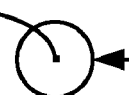 ←—— word line direction ——→

Fig. 2D
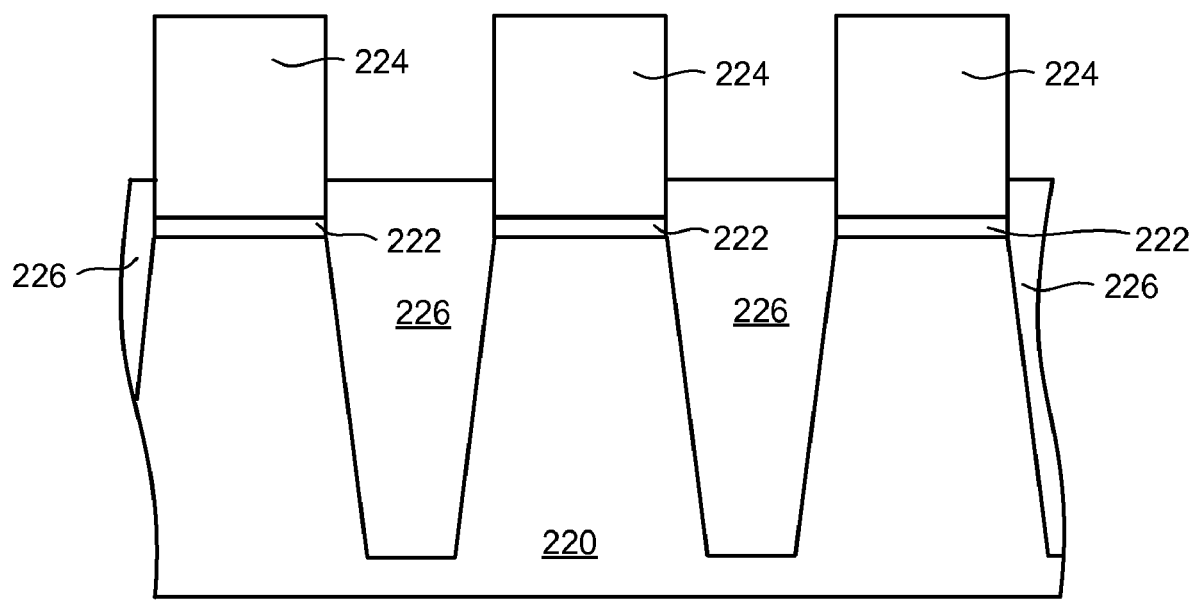
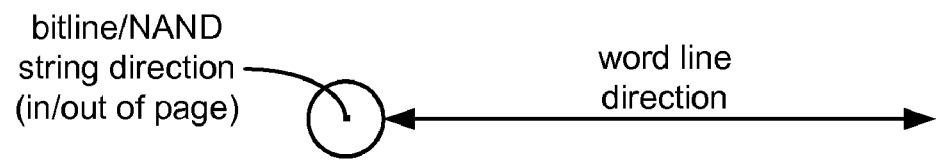

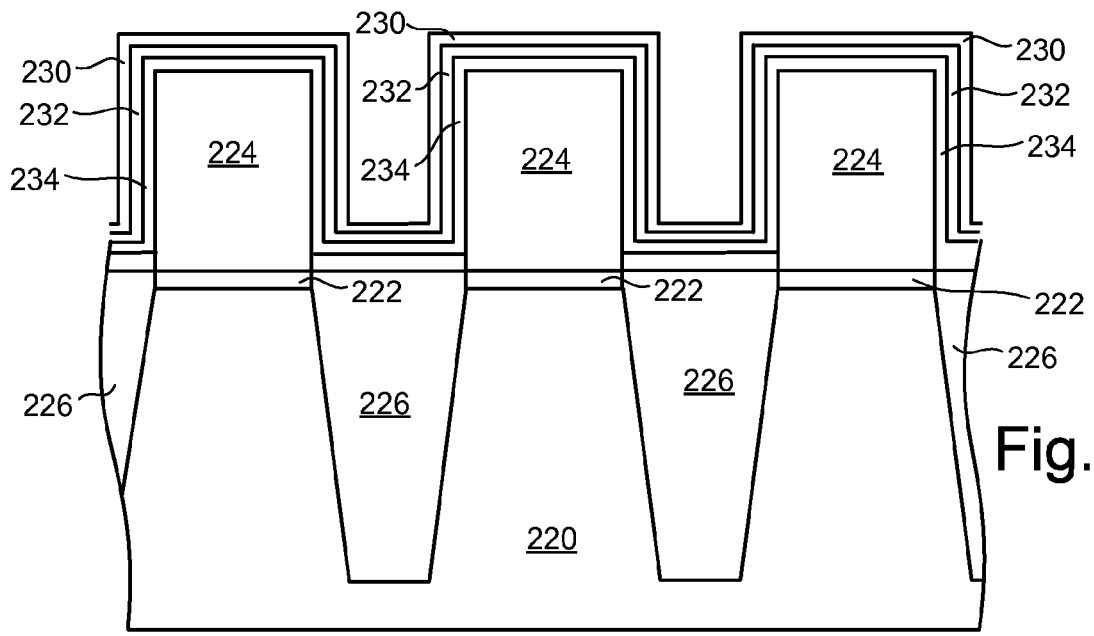
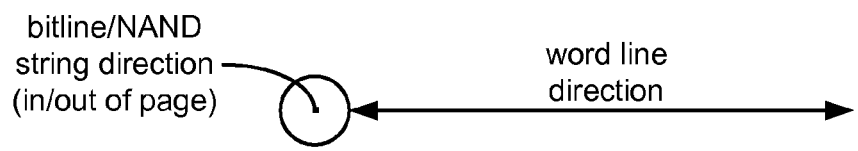
Fig. 2E
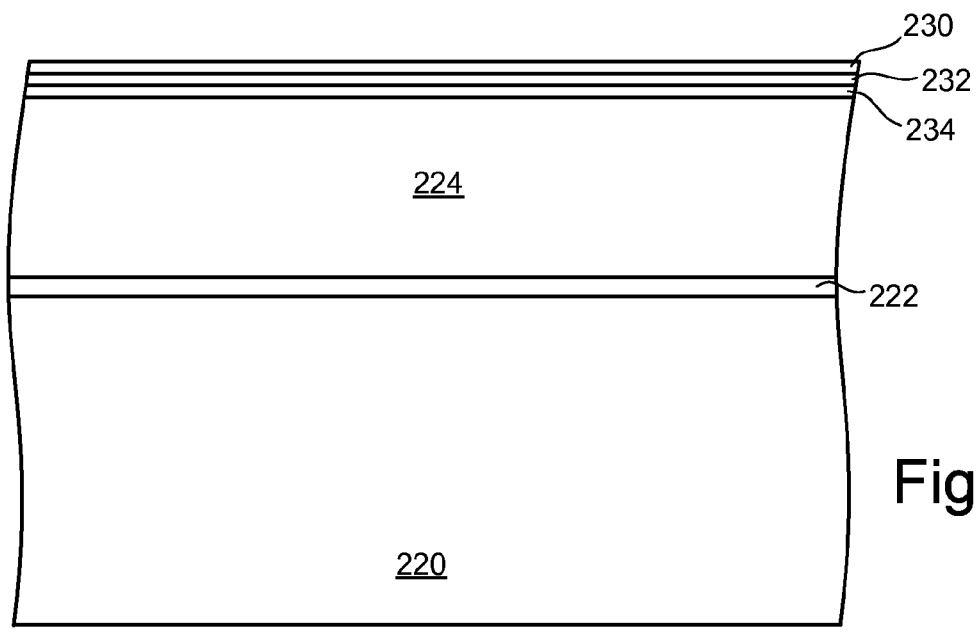
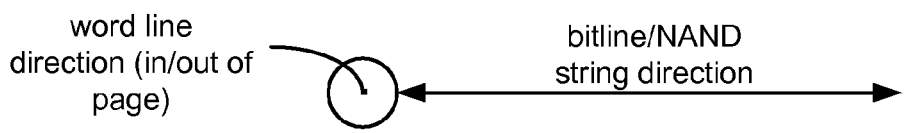
Fig. 2F

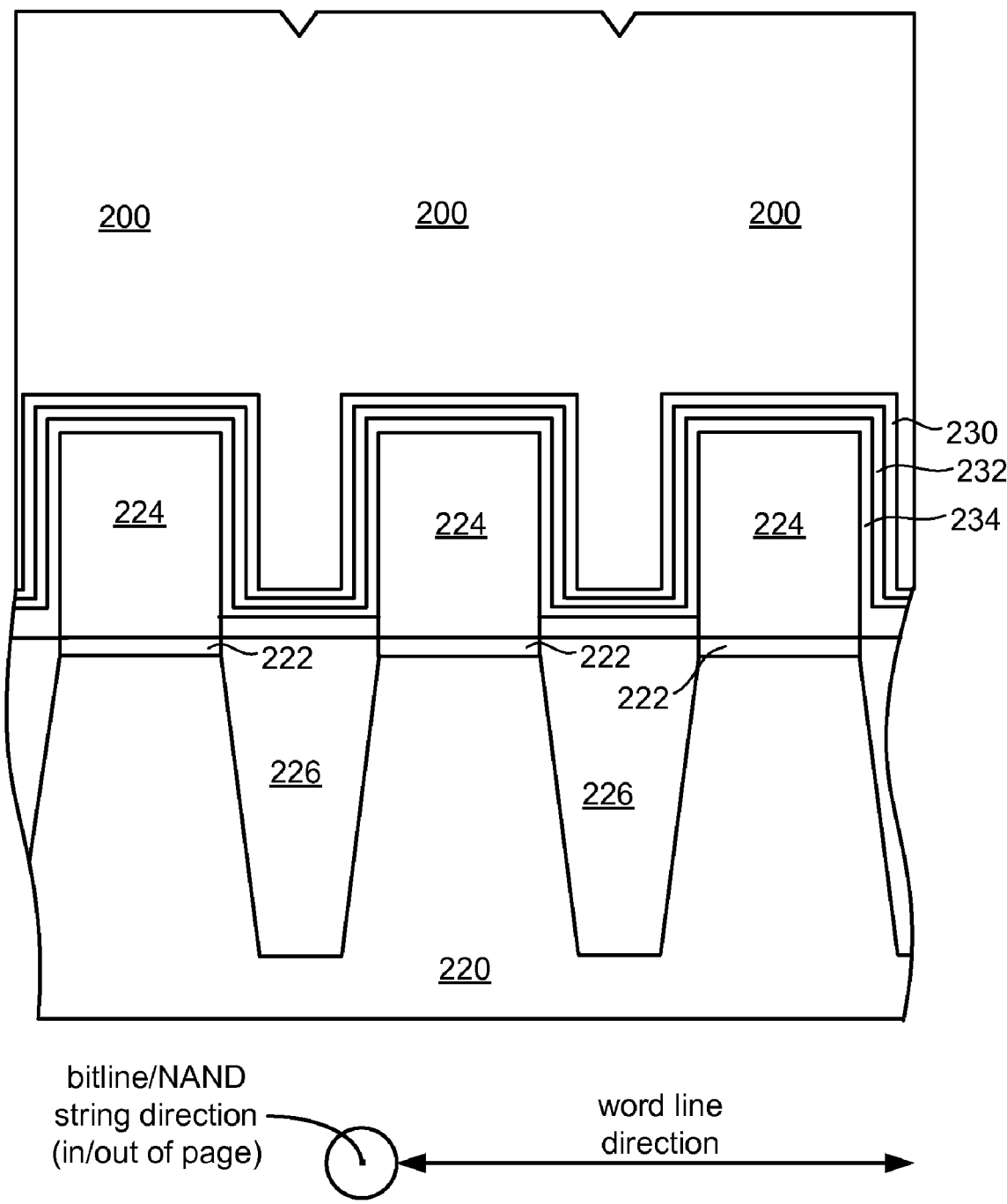

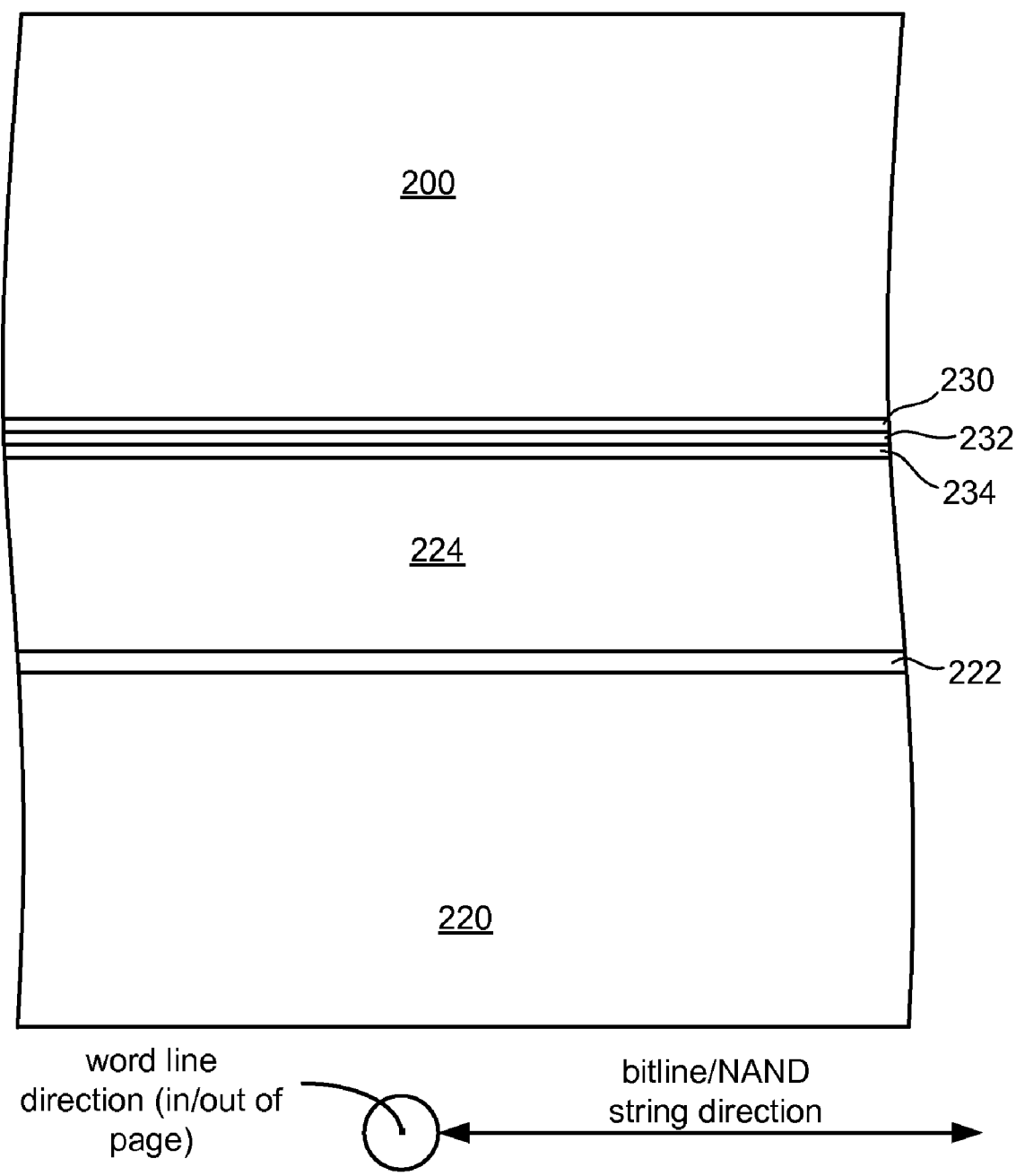

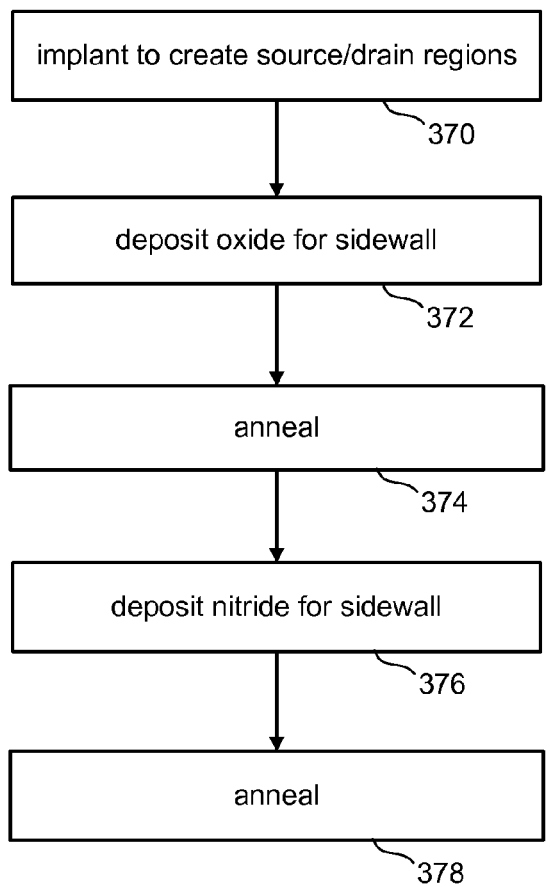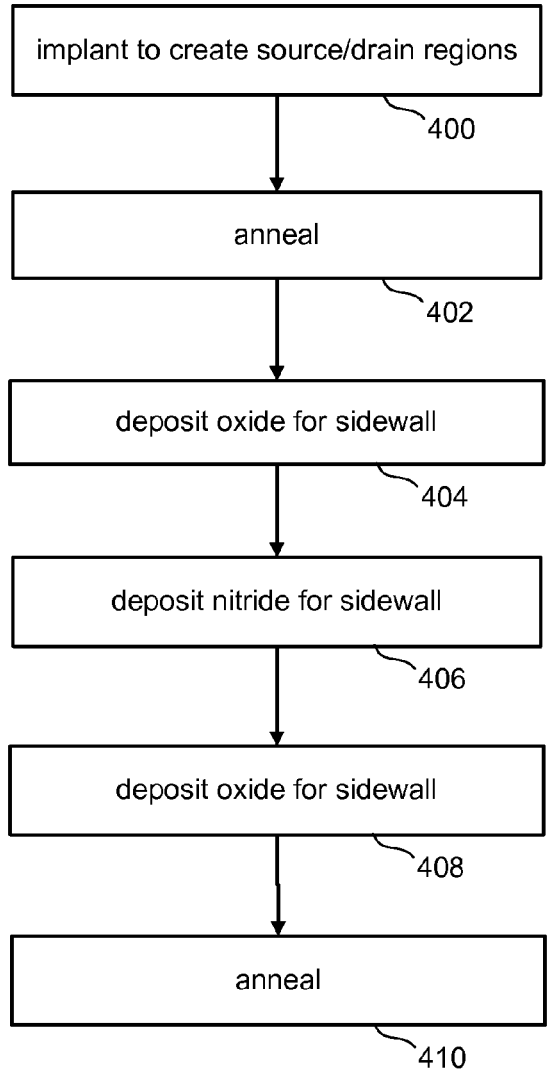

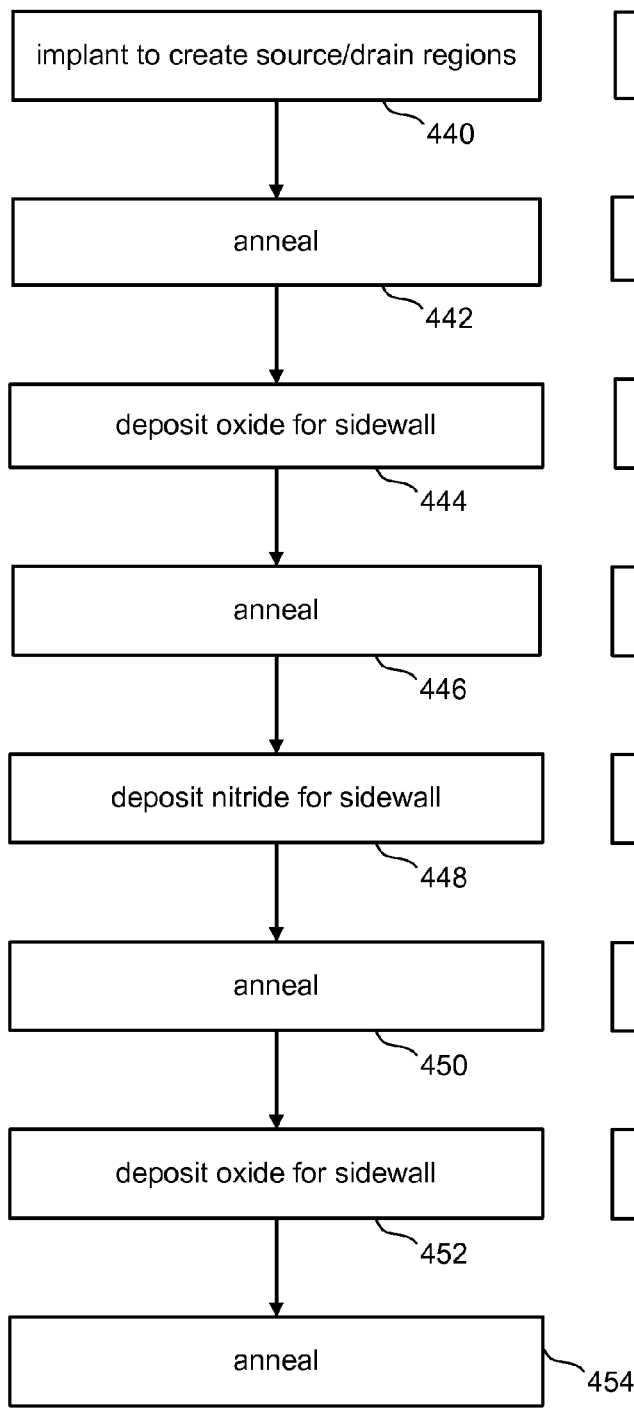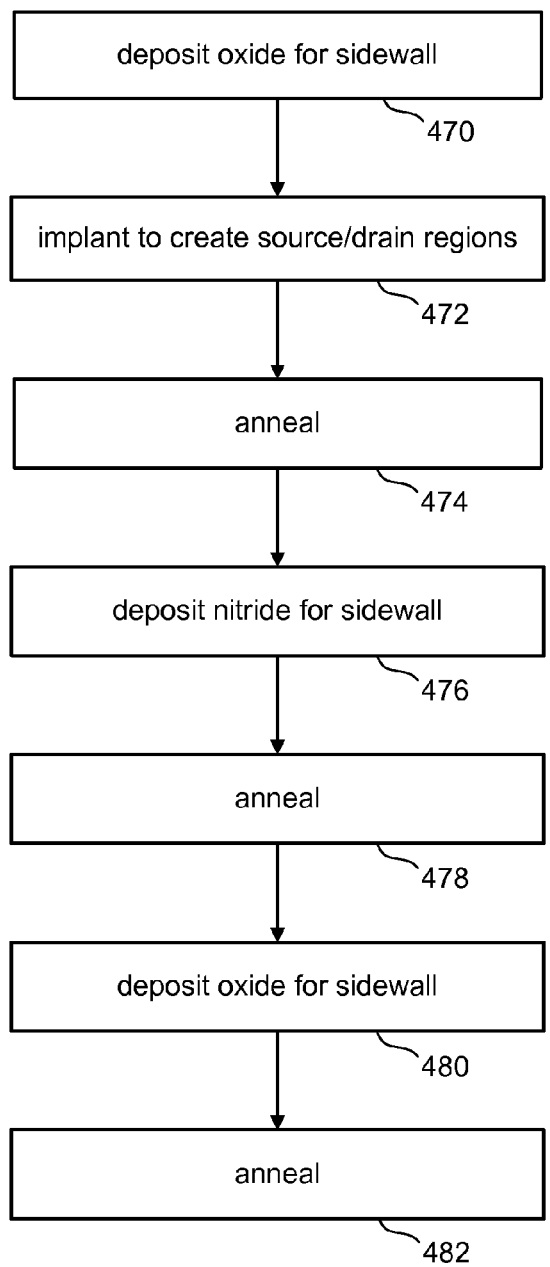

SCALED DIELECTRIC ENABLED BY STACK SIDEWALL PROCESS

BACKGROUND OF THE INVENTION

1. Field of the Invention

The present invention relates to a non-volatile memory.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over the floating gate. The control gate is insulated from the floating gate by a dielectric region. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, between two select gates. The transistors in series and the select gates are referred to as a NAND string. Relevant examples of NAND type flash memories and their operation are provided in the following patent documents, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of non-volatile storage in addition to NAND.

One proposal for a dielectric region between the control gate and the floating gate is to use silicon oxide $SiO_2$ (hereinafter referred to as oxide). Another proposal is to use an oxide-nitride-oxide ("ONO") configuration that includes an inner layer of silicon nitride SiN (hereinafter referred to as nitride) sandwiched between outer layers of oxide. ONO is an improvement over a simple oxide dielectric because the inner nitride layer can provide trap sites, which can be taken advantage of during early application of high voltage stresses by trapping electrons and, thereby, locally raising the band diagram. This trapping and local elevation of the band diagram results in a self healing effect that discourages further leakage (e.g., unwanted conduction) through the dielectric.

While ONO is an improvement over a simple oxide dielectric, there are some drawbacks. For example, during the creation of sidewalls for a transistor, an oxidation process can be used to grow an oxide sidewall. It has been observed that the corners of the floating gate, and the corners of the control gate can oxidize during the sidewall oxidation process and become silicon oxide. This is called the Bird's Beak Effect because the shape of the resultant oxide is in the shape of a bird's beak.

To avoid the above-described Bird's Beak Effect, outer nitride layers have been added to the ONO dielectric to create NONON (nitride-oxide-nitride-oxide-nitride) because nitride is a good barrier to diffusion and, therefore, prevents oxidation. While NONON does not suffer from the Bird's Beak effect, adding the outer nitride layers makes the dielectric thicker. A thicker dielectric can result in a larger memory cell, or an increased amount of floating gate to floating gate capacitance coupling causing capacitive or electric field interference effects. However, the trend is to reduce the size of the memory cell in order to increase density of memory cells so that memory systems can be made with greater amounts of storage relative to cost.

SUMMARY OF THE INVENTION

A non-volatile storage element (or other device) is fabricated with a dielectric between a floating gate and a control gate. One example of a suitable dielectric includes a layer of oxide, a layer of nitride and a second layer of oxide, all deposited using Atomic Layer Deposition (ALD) or other processes. After the deposition of various layers that are subsequent to forming the dielectric between the floating gate and the control gate, the stack of multiple layers is etched to form word lines and the etch is continued to separate the floating gate material layer strips into individual floating gates. An implant (or other) process is used to create source/drain regions. A sidewall process is used that prevents a Bird's Beak Effect from occurring in the dielectric between the floating gate and the control gate during the side wall fabrication by using ALD to deposit oxide and nitride sidewall layers that may include an oxide layer followed by a nitride layer, an oxide layer followed by a nitride layer and then followed by another oxide layer, an oxide layer followed by another oxide layer with the implant performed after the deposition of the first oxide layer but before the deposition of the second oxide layer. All oxide layers may be interchanged with oxynitride layers. To offset the implant from the stack edge the implant may be performed before or after the deposition of any of the sidewall oxide, oxynitride, or nitride layers.

One embodiment of a fabrication process comprises creating a floating gate stack on a substrate including creating a floating gate, creating a control gate and creating an ONO dielectric region between the floating gate and the control gate. The creation of the ONO dielectric region includes using a deposition process to create at least the nitride layer. The fabrication process further includes creating a sidewall for the floating gate stack including depositing a sidewall oxide layer using ALD and depositing a sidewall nitride layer using ALD, and forming source/drain regions in the substrate prior to completing the creation of the sidewall.

One embodiment of a fabrication process includes adding a first dielectric region on a substrate, creating a floating gate adjacent to the first dielectric region, creating a second dielectric region adjacent to the floating gate, creating a control gate adjacent to the second dielectric region, forming source/drain regions in the substrate, creating an oxide sidewall layer for the floating gate and the second dielectric region using ALD after forming the source/drain regions, and creating a nitride sidewall layer for the floating gate and the second dielectric region using ALD after forming the source/drain regions. The creating of the second dielectric region includes depositing a first outer oxide layer, depositing an inner nitride layer using ALD and depositing a second outer oxide layer.

One embodiment of a fabrication process includes creating a first conductive gate layer, creating an ONO layer using ALD for at least part of the creating of the ONO layer, creating a second conductive layer (where the ONO layer is between the first conductive layer and the second conductive layer, forming source/drain regions, and creating a sidewall for the etched stack that consists of the first conductive layer, the ONO layer, the second conductive layer and possibly the remaining hard mask material above the second conductive layer. The hard mask material is typically made of nitride. The sidewall includes at least a first oxide layer. The creating of the sidewall is completed after completing the forming of the source/drain regions.

BRIEF DESCRIPTION OF THE DRAWINGS

FIGS. 2B-2L depict a portion of one embodiment of a memory array at various stages of the manufacturing process.

FIG. 5 is a flow chart describing one embodiment of a process for creating source/drain regions and sidewalls.

FIG. 6 is a flow chart describing one embodiment of a process for creating source/drain regions and sidewalls.

FIG. 7 is a flow chart describing one embodiment of a process for creating source/drain regions and sidewalls.

FIG. 8 is a flow chart describing one embodiment of a process for creating source/drain regions and sidewalls.

DETAILED DESCRIPTION

Figure 1:
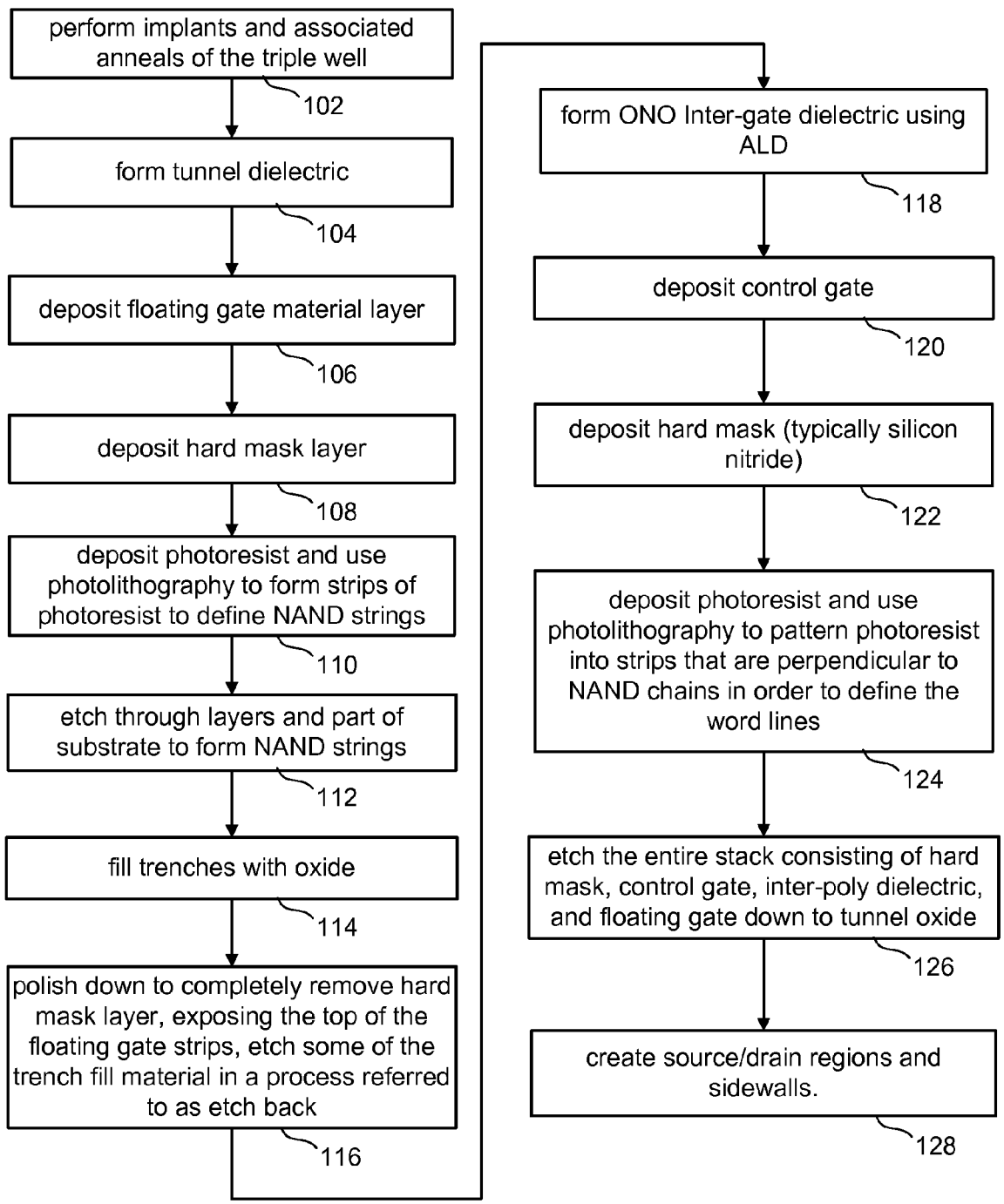
FIG. 1 is a flow chart describing one embodiment of the front end of a process for manufacturing a memory cell.

FIG. 1 is a flow chart describing one embodiment of the front end of a process for manufacturing a memory cell that describes the process steps as far as forming the sidewalls. This flow does not cover the optional booster plates or fins, the gap fill of etched volumes between the stacks, or forming the contacts, metallizations, vias, and passivation. While a flash memory will consist of both peripheral circuitry, which includes a variety of low, medium, and high voltage transistors, and the core memory array, the process steps of FIG. 1 are intended only to describe in general terms one possible process for the fabrication of the core memory array. Many photolithography, etch, implant, diffusion and oxidation steps that are intended for the fabrication of the peripheral transistors are omitted (but are known in the art).

Figure 2A:
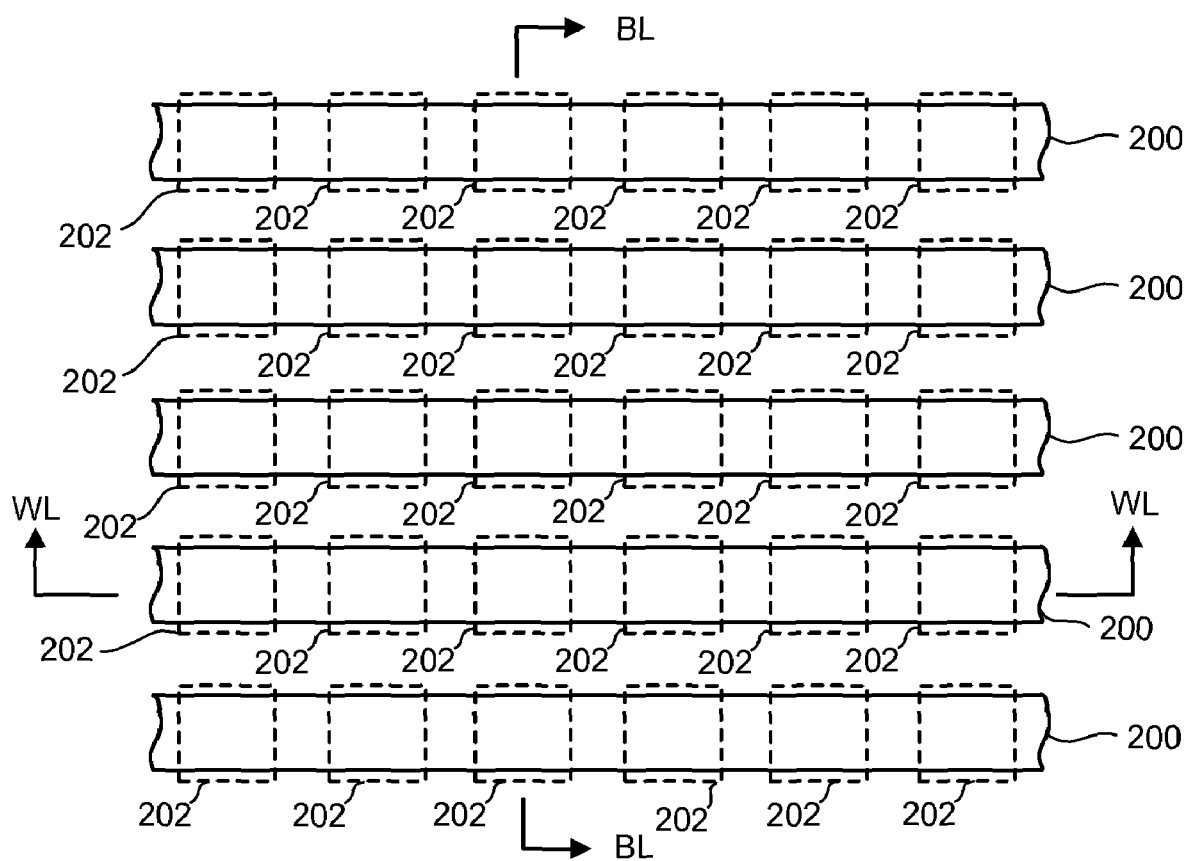
FIG. 2A depicts a top view of a portion of one embodiment of a memory array.

FIGS. 2A-2L will be used to explain the process of FIG. 1. FIG. 2A shows a top view of a portion of a memory array that includes floating gates 202 and word lines 200. FIGS. 2C, 2D, 2E, and 2G depict cross sections WL along the word line. FIGS. 2F, 2H, 2I, 2J, 2K, and 2L depict cross sections BL along the bit line. The cross sections along the bit line can show multiple memory cells that are in the same NAND string, while the cross sections along the word line can show multiple memory cells connected to the same word line but that are in different NAND strings. FIG. 2B can be used to depict a cross section along WL or BL.

Figure 9:
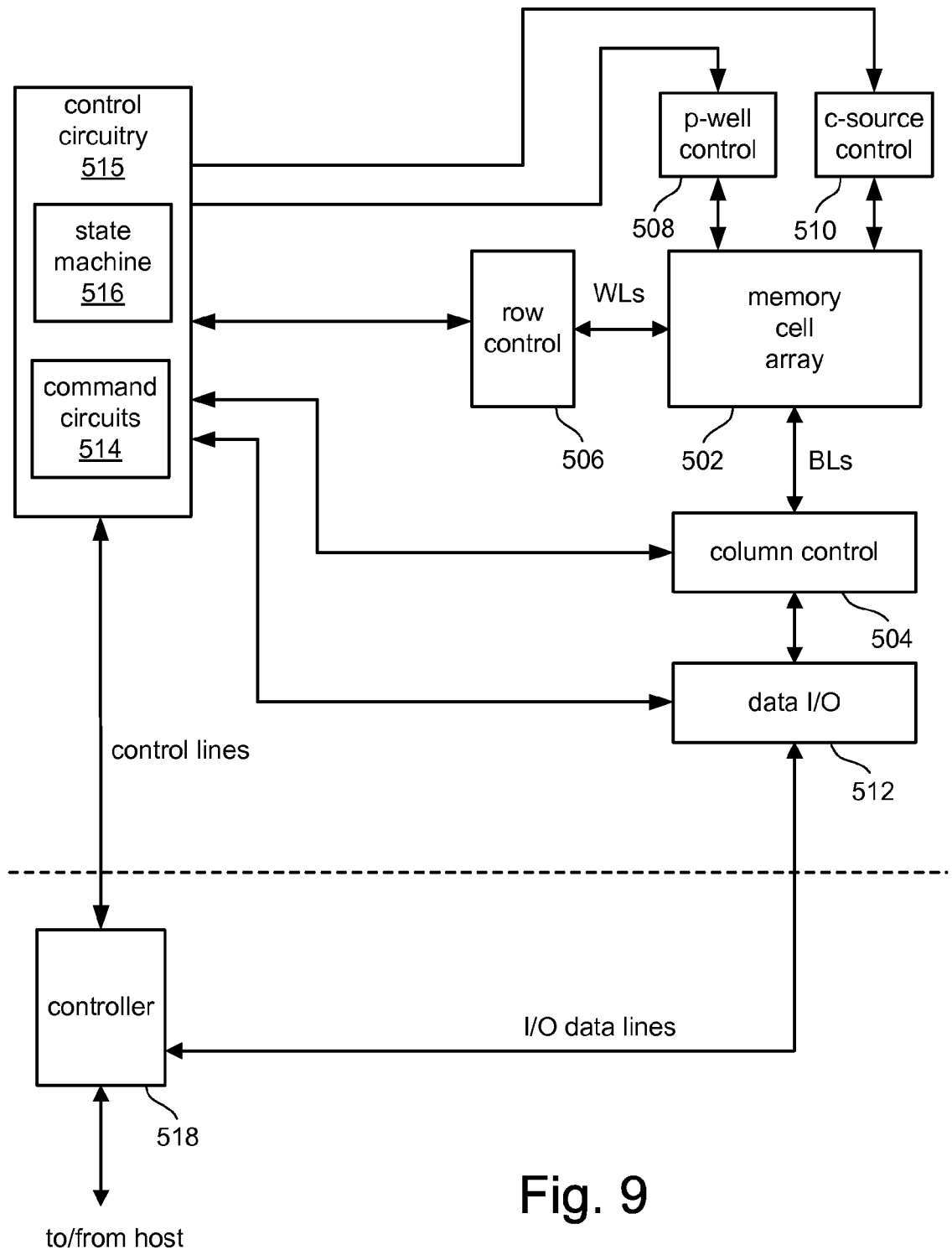
FIG. 9 is a block diagram of one example of a memory system.

Step 102 of FIG. 9 includes performing implants and associated anneals of the triple well. The result of step 102 includes a P substrate, an N-well within the P-substrate, and a P-Well within the N-well. In step 104, a tunnel dielectric layer is formed on top of the P-Well. In step 106, the floating gate is deposited over the tunnel dielectric layer using Chemical Vapor Deposition (CVD) including Metal Organic CVD (MOCVD), Physical Vapor Deposition (PVD), Atomic Layer Deposition (ALD), or another suitable method. In one embodiment, the floating gate is polysilicon. The result of step 106 is depicted in FIG. 2B, which shows floating gate layer 224 deposited on top of tunnel dielectric layer 222 and tunnel dielectric layer 222 on top of P-well 220.

Step 108 includes depositing a hard mask using, for example, CVD, to deposit $Si_3N_4$. In step 110, photolithography is used to form strips of photoresist over what will become the NAND strings. Step 112 includes etching through all layers, including part of the substrate. First, the hard mask is etched through using anisotropic plasma etching, (i.e. reactive ion etching with the proper balance between physical and chemical etching for each planar layer encountered). After the hard mask layer is etched into strips, the photoresist can be stripped away and the hard mask layer can be used as the mask for etching the underlying layers. The process, then includes etching through the floating gate material, the tunnel dielectric material and into the substrate to create trenches in the P-well between the NAND strings. FIG. 2C is a cross section along the word line (NAND string/bit line is in and out of the page) that depicts the results of step 112, including depicting the trenches 223 between the etched floating gates 224 and dielectrics 222. A cross section along the bit line would look like FIG. 2B In step 114, the trenches are filled with oxide (or another suitable material) up to the top of the hard mask using CVD, rapid ALD or PSZ STI fill as described in "Void Free and Low Stress Shallow Trench Isolation Technology using P-SOG for sub 0.1 Device" by Jin-Hwa Heo, et. al. in 2002 Symposium on VLSI Technology Digest of Technical Papers, Session 14-1. PSZ STI fill is Polysilazane Shallow trench isolation fill The fill sequence includes spin coat by coater, and density by furnace. Si—N bond conversion to Si—O bond enables less shrinkage than conventional SOG (Spin On Glass). Steam oxidation is effective for efficient conversion. One proposal is to use Spin-On-Glass (SOG) for the dielectric layer, which is called polysilazane-based SOG (SZ-SOG), a material used in integrating the inter layer dielectric (ILD) applications because of its excellent gap filling and planarization properties, and thermal oxide like film qualities.

In step 116, Chemical Mechanical Polishing (CMP), or another suitable process, is used to polish the oxide material flat until reaching the floating gate material. Another embodiment for this step includes using CMP to polish down to the nitride hard mask, then selectively etching the nitride hard mask, this followed by another operation to remove the remaining protruding oxide until the wafer becomes flat as the floating gate material is exposed on the surface. Step 116 also includes etching back some of the trench oxide in order to provide a cavity that will allow the ONO and the control gates to wrap around the floating gates. FIG. 2D shows the results of step 116. Note that the etch back stops short of (by 10 to 20 nm) reaching the top of the tunnel oxide in order for the control gate not to get too close to the edge of the channel, as this could cause tunneling between control gate and channel during program and/or erase operations, and the control gate could directly turn on the edges of the channel bypassing the floating gate. The etch back is a timed etch, and there is no transition between one material layer and another material layer that may have provided a stop etch material interface.

In step 118, the inter-gate (also called inter-poly) dielectric is grown or deposited using ALD, CVD, PVD, Jet Vapor Deposition (JVD) or another suitable process. In one set of embodiments, the inter-gate dielectric is an ONO region where the first outer oxide layer is deposited using ALD, the inner nitride layer is deposited using ALD, and the second outer oxide region is deposited using ALD. In one implementation, the first outer oxide layer has a thickness of 50 Å, the inner nitride layer has a thickness of 20 Å, and the second outer oxide region has a thickness of 50 Å. In another embodiment, the inner nitride layer is deposited using ALD and the outer oxide layers are deposited using CVD or another process. FIG. 2E is a cross section WL along the word line direction that depicts the results of step 118. FIG. 2F is a cross section BL along the bit line direction that depicts the results of step 118. Both FIGS. 2E and 2F show first outer oxide layer 234, inner nitride layer 232 and second outer oxide layer 230. FIG. 2E shows how the ONO region wraps around the floating gates 224. In other embodiments, outer nitride regions are added to the ONO region. These outer nitride regions are typically formed by a plasma Nitridation method as opposed to deposition. The plasma Nitridation converts silicon or silicon oxide into silicon nitride, and may help smooth out surface roughnesses. Examples of plasma Nitridation include SPA (Slot Plane Antenna) by Tokyo Electron, or DPN (Decoupled Plasma Nitridation) by Applied Materials.

In other embodiments, instead of using an ONO region, the inter-poly dielectric could be formed of nitride-oxide-nitride-oxide-nitride (NONON) deposited using ALD (with or without SPA/DPN used for outer N's), SiON (with or without gradual grading of N concentration with depth), replacing the oxide or nitride with SiON's of various concentrations, SiON/HfSiON/SiON, SiON/AlON/SiON, ISSG or WVG (Water Vapor Generation) used on $SiO_2$ or SiN to anneal them or to convert nitride into SiON with high N content, or OXO with a very thin X layer made of aluminum oxide or HfSiON and O oxide layers that are 5 nm or thicker.

In step 120, the one or more layers of the control gate are deposited on the inter-gate dielectric. In one embodiment, the materials deposited during step 120 include poly-silicon, while in other embodiments this layer may be a metal layer with a proper work function, thermal stability, and etch characteristics. In some embodiments, the control gate is composed of a poly-silicon layer, tungsten-nitride layer, and tungsten layer. Other embodiments of the control gate include partially or fully silicided word lines using tungsten silicide, cobalt silicide, or nickel silicide. These materials can be deposited in a blanket form using CVD, ALD, PVD or other suitable process. FIG. 2G is a cross section WL along the word line direction that depicts the results of step 120. FIG. 2H is a cross section BL along the bit line direction that depicts the results of step 120. FIG. 2G shows control gate/word line layer 200, first outer oxide layer 234, inner nitride layer 232 and second outer oxide layer 230 wrapping around floating gates 224 in the word line direction. FIG. 2H shows control gate/word line layer 200 above second outer oxide layer 230; however, control gate/word line layer 200 does not wrap around the floating gates 224 in the bit line direction.

Figure 2I:
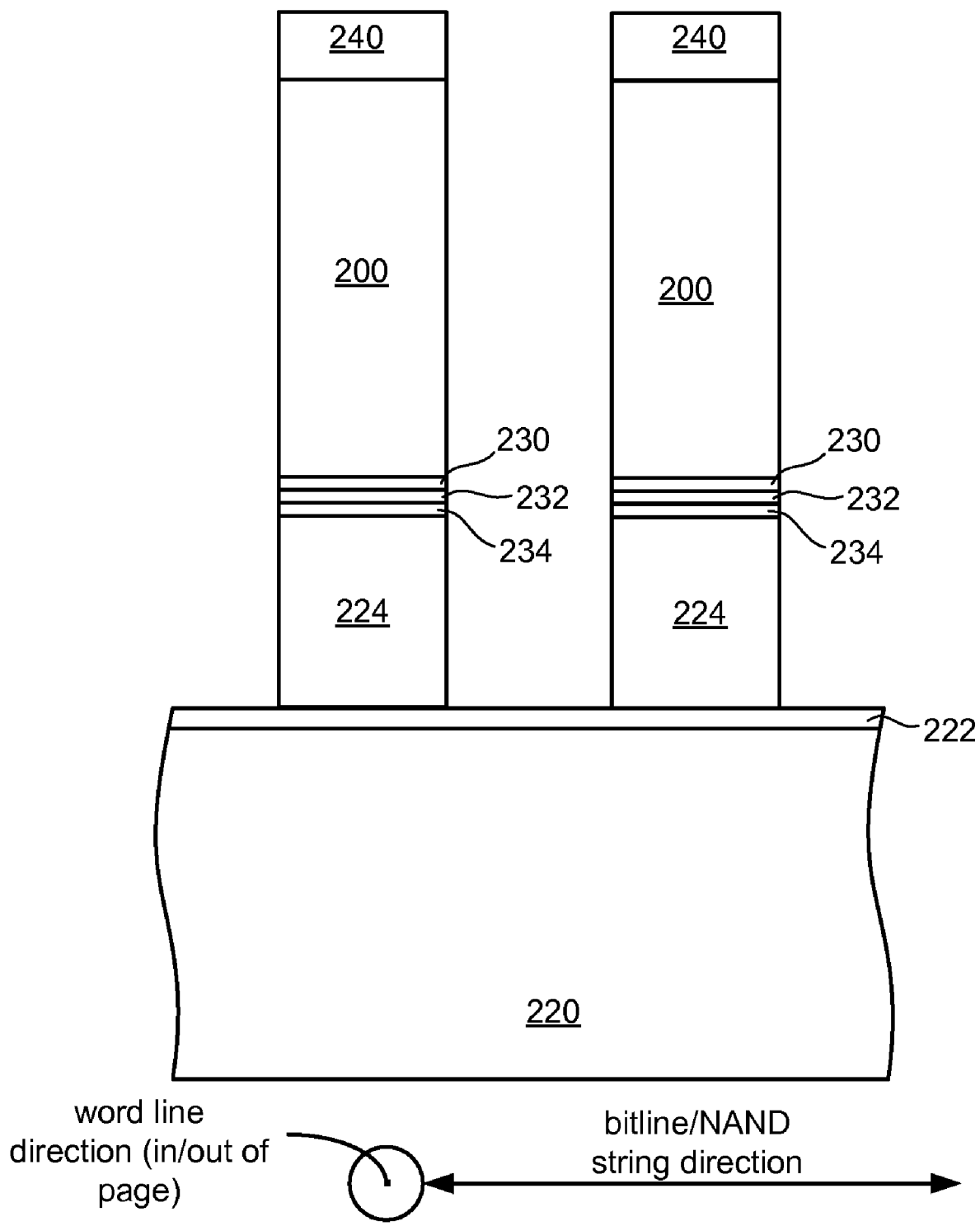

On top of the control gate material layer, a hard mask of $Si_3N_4$ is deposited using, for example, CVD in step 122. In step 124, photolithography is used to create patterns of strips perpendicular to the NAND string, in order to etch the floating gate stacks 202 and form word lines (i.e. control gates) that are isolated from one another. In step 126, etching is performed using plasma etching, ion milling, ion etching that is purely physical etching, or another suitable process to etch the various layers and form the individual word lines. FIG. 2I is a cross section BL along the bit line direction that shows the results of step 126. The etching has defined the floating gate stack to include a hard mask 240, control gate 200, ONO (230,232,234), floating gate 224 and tunnel dielectric 222. In the word line direction, a cross section view after step 126 would look like FIG. 2G. In step 128, the source/drain regions are created and the sidewalls for the floating gate stack are created. FIGS. 3-8 depict different embodiments of step 128, and will be discussed in more detail below.

Figure 2J:
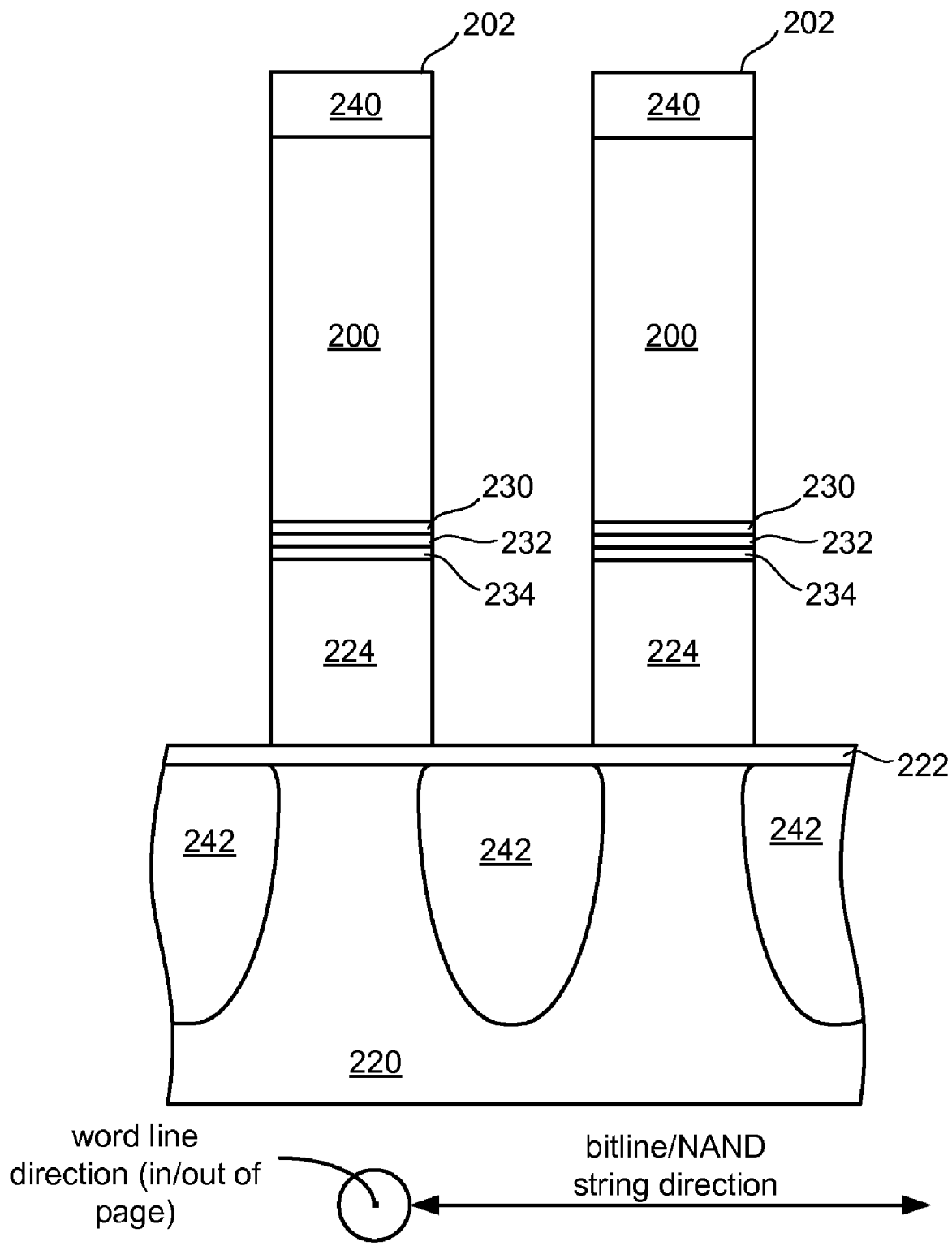
Figure 3:
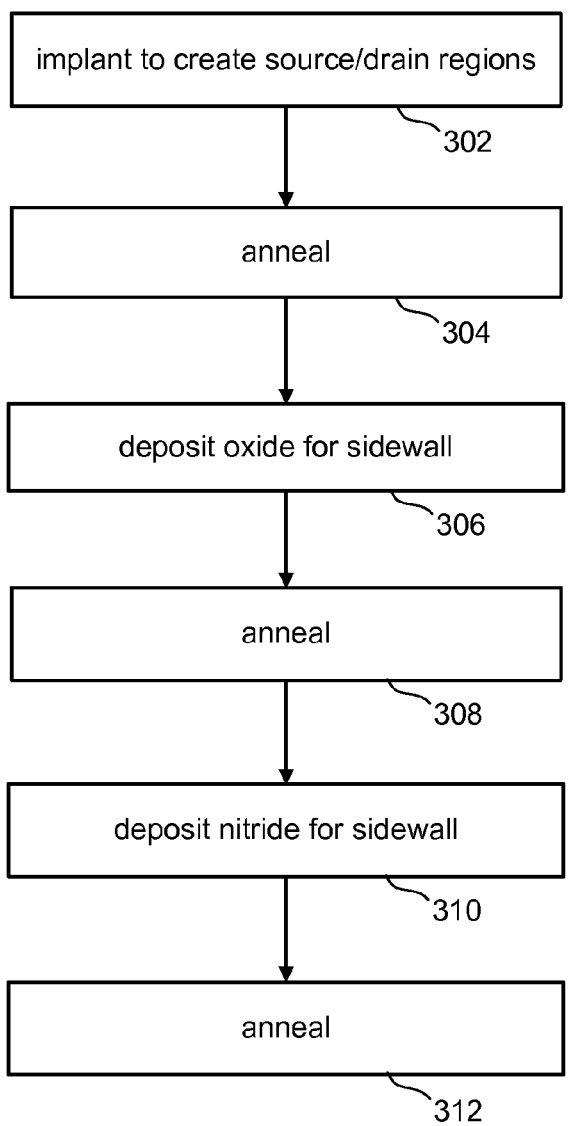
FIG. 3 is a flow chart describing one embodiment of a process for creating source/drain regions and sidewalls.

FIG. 3 describes a first embodiment of a process for creating source/drain regions and sidewalls according to step 128. In step 302, an implant process is performed to create the N+ source/drain regions by Arsenic implantation (or another suitable process). In one embodiment, a halo implant is also used. The regions are called "source/drain" regions because they can operate as source regions, drain regions or both. For example, two neighboring memory cells on a NAND string will share a source/drain region. For one of the memory cells the source/drain region operates as a source region, and for the other memory cell the source/drain region operates as a drain region. In step 304, an anneal process is performed. FIG. 2J show a cross section BL along the bit line direction after step 304 is performed. As can be seen, between the floating gate stacks 202 are source/drain regions 242 implanted into the P-well 220. In the word line direction, a cross section view after step 304 would look like FIG. 2G.

Figure 2K:
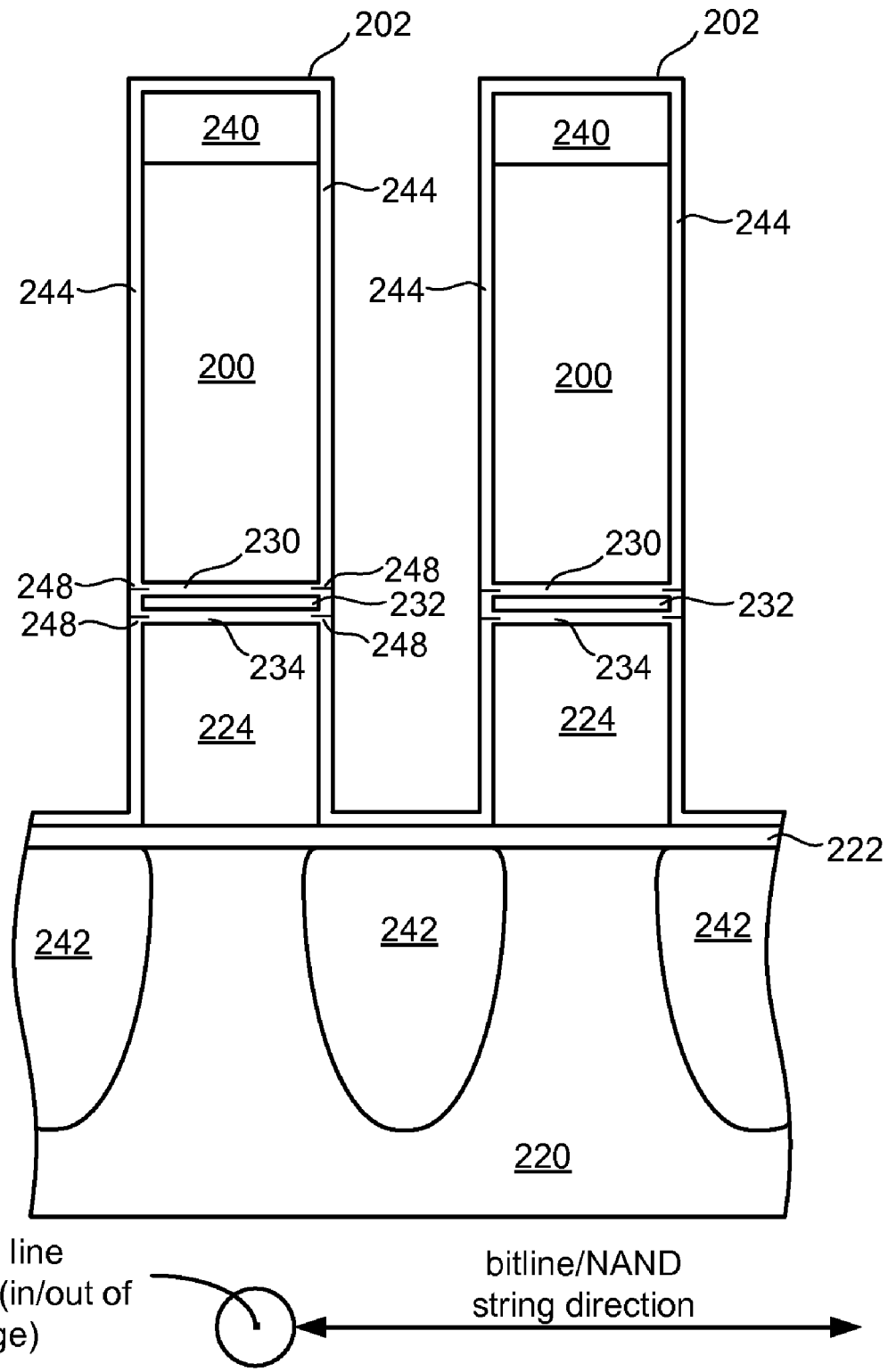

In step 306, an oxide layer is deposited as a sidewall. In one embodiment, the oxide layer is deposited using ALD and the oxide layer has a thickness of 50 Å. In step 308, an anneal process is performed. FIG. 2K show a cross section BL along the bit line direction after step 308 is performed. As can be seen, floating gate stacks 202 include oxide sidewall 244. In one embodiment, during the etching of the control gate/floating gate stack, the sides of the oxide layers of the ONO inter-gate dielectric will etch more than the sides of the nitride layers causing dimples in the oxide layers 230 and 234. During steps 306 and 308, these dimples will be filled in, as depicted by seams 248.

Figure 2L:
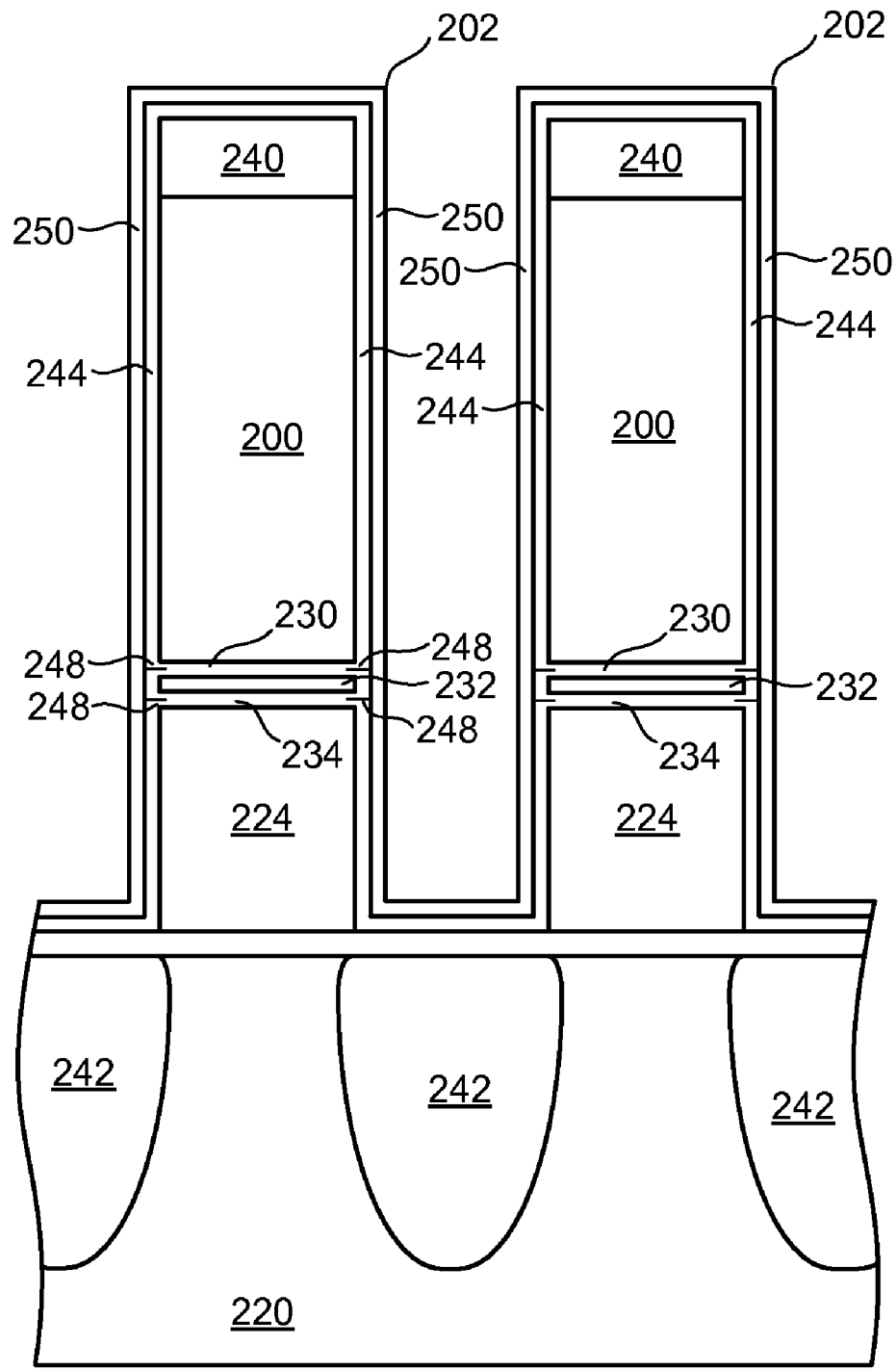

In step 310, a nitride layer is deposited as a sidewall. In one embodiment, the nitride layer is deposited using ALD and the nitride layer has a thickness of 30 Å. In step 312, an anneal process is performed. In one embodiment, steps 308 and 312 are high temperature anneals that use a low concentration of oxygen. For example, the annealing may be performed in an inert ambient such as nitrogen gas with trace amounts of oxygen. FIG. 2L show a cross section BL along the bit line direction after step 312 is performed. As can be seen, floating gate stacks 202 include oxide sidewall 244 and nitride sidewall 250. Nitride sidewall 250 is outside of oxide sidewall 244. In some embodiments, the space between floating gate stacks is filled in with oxide. In the word line direction, a cross section view after step 312 would look like FIG. 2G. In some embodiments, nitride sidewall 250 can be added using a process other than ALD. In the process of FIG. 3, the source/drain regions are completed prior to starting the sidewalls.

Figure 4:
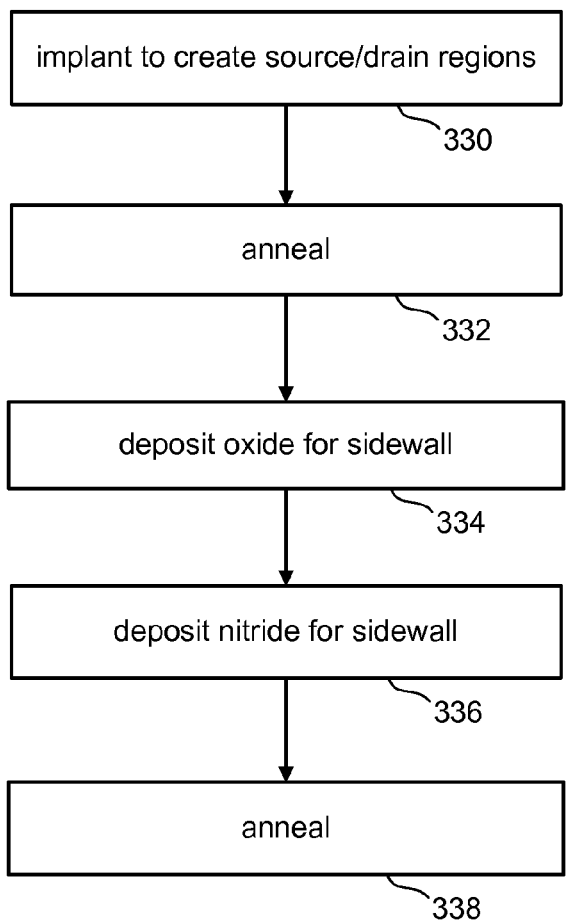
FIG. 4 is a flow chart describing one embodiment of a process for creating source/drain regions and sidewalls.

FIG. 4 describes another embodiment of a process for creating source/drain regions and sidewalls according to step 128. In step 330, an implant process is performed to create the N+ source/drain regions. In step 332, an anneal process is performed. In step 334, an oxide layer is deposited as a sidewall using ALD. In step 336, a nitride layer is deposited as a sidewall using ALD (or another process). In step 338, an anneal process is performed. Thus, the anneal process is performed after both deposition steps are performed rather than after each deposition step. In the process of FIG. 4, the source/drain regions are completed prior to starting the sidewalls.

FIG. 5 describes another embodiment of a process for creating source/drain regions and sidewalls according to step 128. In step 370, an implant process is performed to create the N+ source/drain regions. In step 372, an oxide layer is deposited as a sidewall using ALD. In step 374, an anneal process is formed that anneals the source/drain regions and the oxide sidewall. In step 376, a nitride layer is deposited as a sidewall using ALD (or another process). In step 378, an anneal process is performed. In the embodiment of FIG. 5, the sidewall creation process starts before the source/drain regions are annealed; however, the sidewall is completed after the source/drain regions are completed because the nitride layer is started after annealing the source/drain regions.

FIG. 6 describes another embodiment of a process for creating source/drain regions and sidewalls according to step 128, where the sidewalls include three layers (e.g., oxide-nitride-oxide). In step 400, an implant process is performed to create the N+ source/drain regions. In step 402, an anneal process is performed. In step 404, an oxide layer is deposited as a sidewall using ALD. In step 406, a nitride layer is deposited as a sidewall using ALD (or another process). In step 408, an oxide layer is deposited as a sidewall using ALD. In step 410, an anneal process is performed. In the process of FIG. 6, the source/drain regions are completed prior to starting the sidewalls.

FIG. 7 describes another embodiment of a process for creating source/drain regions and sidewalls according to step 128, where the sidewalls include three layers (e.g., oxide-nitride-oxide) and an anneal process is performed after each of the three layers. In step 440, an implant process is performed to create the N+ source/drain regions. In step 442, an anneal process is performed. In step 444, an oxide layer is deposited as a sidewall using ALD. In step 446, an anneal process is performed. In step 448, a nitride layer is deposited as a sidewall using ALD (or another process). In step 450, an anneal process is performed. In step 452, an oxide layer is deposited as a sidewall using ALD. In step 454, an anneal process is performed. In the process of FIG. 7, the source/drain regions are completed prior to starting the side walls.

In some embodiments, it may be advantageous to first deposit some, or all, of the first layer of the stack side wall, and then perform the source/drain implant. This is done in order to offset, by a proper amount the implant from the floating gate edge, as subsequent high temperature processes such as the implant anneal can move the source/drain implant dopants too far under the floating gate forming shorter channels than intended. In order to avoid this condition it is possible to deposit part of stack side wall materials first, and then perform the implant, and then finish the deposition of the side wall materials. In some embodiments, the entire stack side wall material, and for that matter, the entire cavity between the stacks, are made out of oxide which has the highest energy barrier and the lowest dielectric constant (excluding low-K materials which are not suitable for high electric field and low leakage requirements of inter-stack material). However, some control gate stack materials such as a control gate consisting of poly-silicon, tungsten nitride, and tungsten may require a nitride barrier layer incorporated into the stack side wall structure. Another reason to incorporate a thin nitride layer into the stack side wall may be to limit the diffusion of various species including oxygen which may lead to undesirable Bird's Beak Effects.

FIG. 8 describes an embodiment of a process for creating source/drain regions and sidewalls according to step 128, where the sidewalls creation process is started before the source/drain regions are created, but the side wall creation process is finished after the source/drain regions' creation is finished. In step 470, an oxide layer is deposited as a sidewall using ALD. In step 472, an implant process is performed to create the N+ source/drain regions. In step 474, an anneal process is performed. In step 476, a nitride layer (or another oxide layer) is deposited as a sidewall using ALD (or another process). In step 478, an anneal process is performed. In step 480, oxide layer is deposited as a sidewall using ALD. In step 482, an anneal process is performed. In the process of FIG. 8, the source/drain regions are completed at step 474; however, the sidewall is not completed until step 482.

In another embodiment, implants can be performed before and between any two side wall deposition layers where the individually deposited layers may or may not be composed of the same material, e.g. implant, deposit 5 nm of oxide, implant, deposit 3 nm of oxide, implant, deposit 2 nm of nitride, implant again. Each implant can be annealed as often as right after each implant or as infrequently annealed as a single final anneal. This may be useful in defining graded multiple diffused junctions that may provide better immunity to junction leakage that may occur during boosting.

FIG. 9 is a block diagram of one embodiment of a flash memory system that utilizes the memory cell manufactured as described above. Other systems and implementations can also be used.

Memory cell array 502 of FIG. 9 is an array of memory cells fabricated as described above. Memory cell array 502 is controlled by column control circuit 504, row control circuit 506, p-well control circuit 508 and common source control circuit 510. Column control circuit 504 is connected to the bit lines of memory cell array 502 for reading data stored in the memory cells, for determining a state of the memory cells during a program operation, and for controlling potential levels of the bit lines to promote or inhibit programming and erasing. Row control circuit 506 is connected to the word lines to select one of the word lines, to apply read voltages, to apply program voltages combined with the bit line potential levels controlled by column control circuit 504, and to apply an erase voltage. In one embodiment, row control 506 and column control 504 include decoders to select the appropriate word lines and bit lines. Common source control circuit 510 controls a common source line (labeled as "C-source" in FIG. 10) connected to the memory cells. P-well control circuit 508 controls the p-well voltage.

The data stored in the memory cells is read out by the column control circuit 504 and is output to external I/O lines via data input/output buffer 512. Program data to be stored in the memory cells is input to the data input/output buffer 512 via the external I/O lines, and transferred to the column control circuit 504. The external I/O lines are connected to controller 518.

Command data for controlling the flash memory device is input to controller 518. The command data informs the flash memory of what operation is requested. The input command is transferred to state machine 516 which is part of control circuitry 515. State machine 516 controls column control circuit 504, row control circuit 506, common source control 510, p-well control circuit 508 and data input/output buffer 512. State machine 516 can also output status data of the flash memory such as READY/BUSY or PASS/FAIL.

Controller 518 is connected to or connectable with a host system such as a personal computer, a digital camera, or personal digital assistant, etc. It communicates with the host that initiates commands, such as to store or read data to or from the memory array 502, and provides or receives such data. Controller 518 converts such commands into command signals that can be interpreted and executed by command circuits 514 which are part of control circuitry 515. Command circuits 514 are in communication with state machine 516. Controller 518 typically contains buffer memory for the user data being written to or read from the memory array.

One exemplary memory system comprises one integrated circuit chip that includes controller 518, and one or more integrated circuit chips that each contain a memory array and associated control, input/output and state machine circuits. The memory arrays and controller circuits of a system can be integrated on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

In some implementations, some of the components of FIG. 9 can be combined. In various designs, one or more of the components of FIG. 9 (alone or in combination), other than memory cell array 502, can be thought of as a managing circuit. For example, a managing circuit may include any one of or a combination of control circuitry 515, command circuits 514, state machine 516, column control circuit 504, row control circuit 506, p-well control circuit 508, common source control circuit 510 and data I/O 512.

Figure 10:
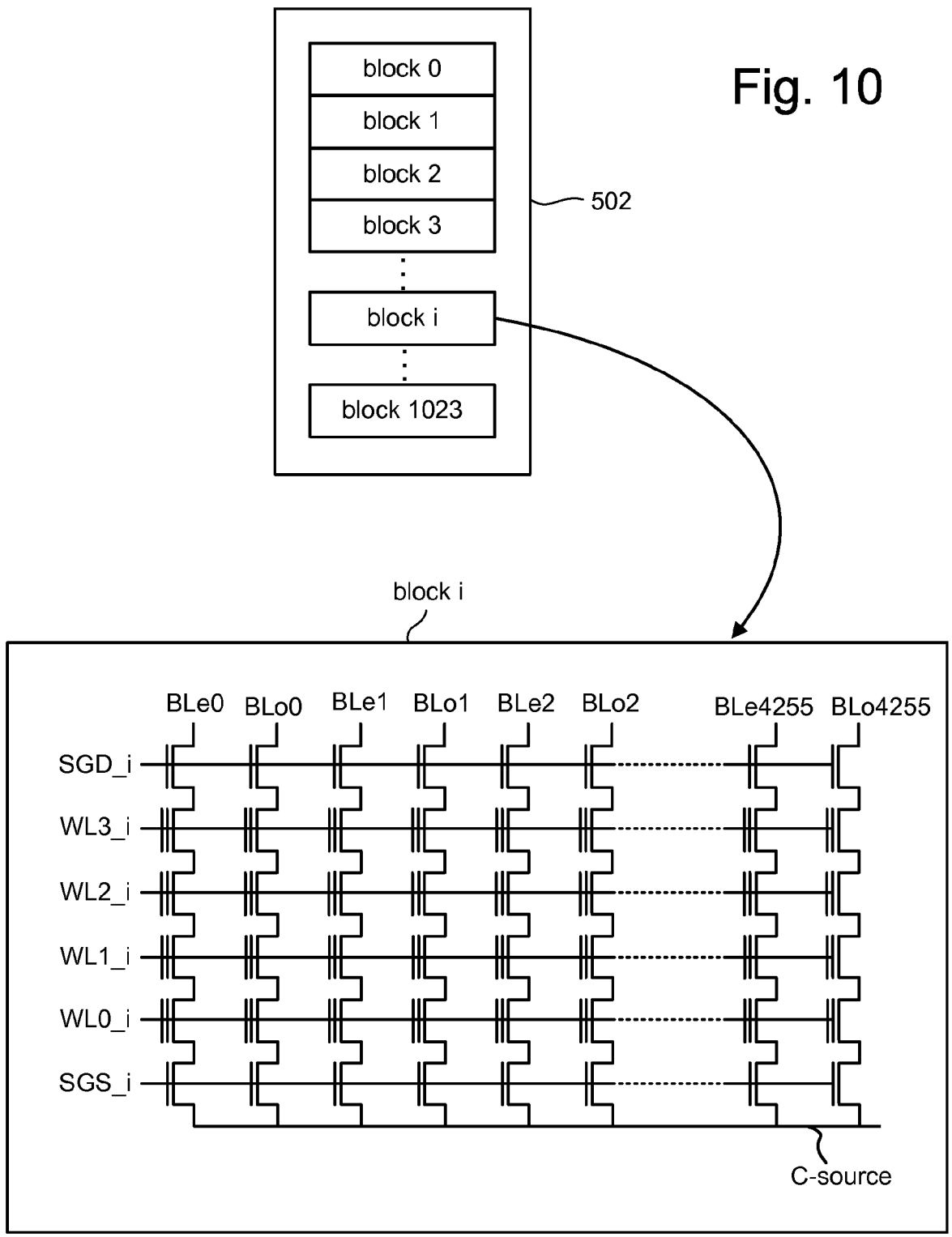
FIG. 10 illustrates an example of an organization of a memory array.

With reference to FIG. 10, an exemplary structure of memory cell array 502 is described. As one example, a NAND flash EEPROM is described that is partitioned into 1,024 blocks of memory cells fabricated as described above. The data stored in each block can be simultaneously erased. In one embodiment, the block is the minimum unit of memory cells that are simultaneously erased. In each block, in this example, there are 8,512 columns. Each block is typically divided into a number of pages which can be a unit of programming. Other units of data for programming are also possible. In one embodiment, individual pages may be divided into segments and the segments may contain the fewest number of cells that are written at one time as a basic programming operation. One or more pages of data are typically stored in one row of memory cells.

In each block of the example in FIG. 10, there are 8,512 columns that are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. FIG. 10 shows four memory cells (fabricated as described above) connected in series to form a NAND string. Although four memory cells are shown to be included in each NAND string, more or less than four can be used (e.g., 16, 32, or another number). One terminal of the NAND string is connected to a corresponding bit line via a drain select gate (connected to select gate drain line SGD), and another terminal is connected to c-source via a source select gate (connected to select gate source line SGS).

In other embodiments, the bit lines are not divided into odd and even bit lines. Such architectures are commonly referred to as all bit line architectures. In an all bit line architecture, all the bit lines of a block can be simultaneously selected during read and program operations. Memory cells along a common word line and connected to any bit line can be programmed or read at the same time.

During read and programming operations of one embodiment using an odd/even bit line architecture, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-state cell), one block stores 16 pages. Other sized blocks and pages can also be used. Additionally, architectures other than that of FIGS. 9 and 10 can also be used to implement embodiments.

In the read and verify operations, the select gates of a selected block are raised to one or more select voltages and the unselected word lines (e.g., WL0, WL1 and WL3) of the selected block are raised to a read pass voltage (e.g. 4.5 volts) to make the transistors operate as pass gates. The selected word line of the selected block (e.g., WL2) is connected to a reference voltage, a level of which is specified for each read and verify operation in order to determine whether a threshold voltage of the concerned memory cell is above or below such level. For example, in a read operation of a binary memory cell, the selected word line WL2 is grounded, so that it is detected whether the threshold voltage is higher than 0V. In a verify operation of a binary memory cell, the selected word line WL2 is connected to 0.8V, for example, so that as programming progresses it is verified whether or not the threshold voltage has reached the target level of 0.8V. The source and p-well are at zero volts during read and verify. The selected bit lines (BLe) are pre-charged to a level of, for example, 0.7V. If the threshold voltage is higher than the read or verify level, the potential level of the concerned bit line (BLe) maintains the high level, because of the associated non-conductive memory cell. On the other hand, if the threshold voltage is lower than the read or verify level, the potential level of the concerned bit line (BLe) decreases to a low level, for example less than 0.5V, because of the conductive memory cell. The state of the memory cell is detected by a sense amplifier that is connected to the bit line and senses the resulting bit line voltage. The difference between whether the memory cell is programmed or erased depends on whether or not net negative charge is stored in the floating gate. For example, if negative charge is stored in the floating gate, the threshold voltage becomes higher and the transistor can be in enhancement mode of operation. In another embodiment, a memory cell can be read by detecting the current conducted by a memory cell.

When programming a flash memory cell, a program voltage is applied to the control gate and the bit line is grounded. Due to the voltage differential between the channel of the flash memory cell and the floating gate, electrons from the channel area under the floating gate are injected into the floating gate. When electrons accumulate in the floating gate, the floating gate becomes negatively charged and the threshold voltage of the memory cell is raised. To apply the program voltage to the control gate of the cell being programmed, that program voltage is applied on the appropriate word line.

During the programming process, the drain and the p-well receive 0 volts while the control gate receives a series of programming pulses with increasing magnitudes. In one embodiment, the magnitudes of the pulses in the series range from 12 volts to 24 volts. In other embodiments, the range of pulses in the series can be different. The magnitude of the pulses is increased with each pulse by a predetermined step size. In one embodiment, an exemplary step size is 0.2 volts (or 0.4 volts). During programming of memory cells, verify operations are carried out in the periods between the programming pulses. The cells that are verified to be sufficiently programmed are locked out, for example in NAND cells, by raising the bit line voltage from 0 to $V_{DD}$ (e.g., 2.5 volts) for all subsequent programming pulses to terminate the programming process for those memory cells.

At the end of a successful program process, the threshold voltages of the memory cells should be within one or more distributions of threshold voltages for programmed memory cells or within a distribution of threshold voltages for erased memory cells, as appropriate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method for fabricating non-volatile storage, comprising:
    creating a floating gate stack on a substrate including creating a floating gate, said floating gate is conductive, creating a control gate and creating an ONO dielectric region between said floating gate and said control gate, said creating said ONO dielectric region includes using a deposition process to create at least a nitride layer of said ONO dielectric region, said creating said ONO dielectric region includes using atomic layer deposition to create a first oxide layer on one side of said nitride layer and using atomic layer deposition to create a second oxide layer on a second side of said nitride layer, said nitride layer is thinner than said first oxide layer and thinner than said second oxide layer, said first oxide layer, said nitride layer and said second oxide layer have relative thicknesses of approximately 5:2:5;
    creating a sidewall for said floating gate stack including depositing a sidewall oxide layer using atomic layer deposition and depositing a sidewall nitride layer using atomic layer deposition; and
    forming source/drain regions in said substrate prior to completing said creating of said sidewall.

2. A method according to claim 1, further comprising: adding outer nitride layers to said ONO region.

3. A method according to claim 1, wherein: said control gate wraps around said floating gate.

4. A method according to claim 1, wherein: said source/drain regions are completed prior to starting said creating of said sidewall.

5. A method according to claim 1, wherein:
    said forming source/drain regions in said substrate includes forming said source/drain regions after depositing sidewall oxide layer and before depositing said sidewall nitride layer.

6. A method according to claim 1, wherein:
    said creating a sidewall includes first annealing after depositing said sidewall oxide layer and second annealing after depositing said sidewall nitride layer; and
    said forming source/drain regions in said substrate includes forming said source/drain regions after depositing said sidewall oxide layer and before said first annealing as well as before depositing said sidewall nitride layer.

7. A method according to claim 1, wherein:
    said creating said sidewall includes creating an additional oxide layer using atomic layer deposition.

8. A method according to claim 7, wherein:
    said creating said sidewall includes annealing after said sidewall oxide layer, said sidewall nitride layer and said additional oxide layer are all deposited; and
    said forming said source/drain regions includes annealing prior to said depositing said sidewall oxide layer.

9. A method according to claim 7, wherein:
    said creating said sidewall includes first annealing after depositing said sidewall oxide layer, second annealing after depositing said sidewall nitride layer and third annealing after depositing said additional oxide layer; and
    said forming said source/drain regions includes annealing prior to said depositing said sidewall oxide layer.

10. A method according to claim 7, wherein:
    said creating said sidewall includes first annealing after depositing said sidewall oxide layer, second annealing after depositing said sidewall nitride layer and third annealing after depositing said additional oxide layer; and
    said forming said source/drain regions includes implanting subsequent to said depositing of said sidewall oxide layer and prior to said first annealing.

11. A method according to claim 1, wherein:
    said creating said sidewall includes annealing after said sidewall oxide layer and said sidewall nitride layer are both deposited; and
    said forming said source/drain regions includes annealing prior to said depositing said sidewall oxide layer.

12. A method according to claim 1, wherein:
    said creating said sidewall includes first annealing after depositing said sidewall oxide layer and prior to depositing said sidewall nitride layer and second annealing after depositing said sidewall nitride layer; and
    said forming said source/drain regions includes annealing prior to said depositing said sidewall oxide layer.

13. A method according to claim 1, wherein:
    said creating said sidewall includes first annealing after depositing said sidewall oxide layer and second annealing after depositing said sidewall nitride layer; and
    said forming said source/drain regions includes implanting prior to said depositing said sidewall oxide layer without annealing after said implanting and prior to said depositing said sidewall oxide layer.

14. A method according to claim 12, wherein said first annealing and said second annealing are high temperature anneals using a low concentration of oxygen that is exposed to the sidewall oxide layer and to the sidewall nitride layer.

15. A method according to claim 12, wherein said first annealing is performed in an inert ambient with trace amounts of oxygen that is exposed to the sidewall oxide layer.

16. A method for fabricating non-volatile storage, comprising:
    adding a first dielectric region on a substrate;
    creating a conductive floating gate adjacent said first dielectric region;
    creating a second dielectric region adjacent said floating gate, said creating said second dielectric region includes depositing a first outer oxide layer, depositing an inner nitride layer using atomic layer deposition and depositing a second outer oxide layer, said nitride layer is thinner than said first oxide layer and thinner than said second oxide layer, the thickness of the inner nitride layer is approximately 40% the thickness of the first outer oxide layer and is approximately 40% the thickness of the second outer oxide layer;

creating a control gate adjacent said second dielectric region;

forming source/drain regions in said substrate;

creating an oxide sidewall layer for said floating gate said second dielectric region using atomic layer deposition after forming said source/drain regions; and creating a nitride sidewall layer for said floating gate and said second dielectric region using atomic layer deposition after forming said source/drain regions.

17. A method according to claim 16, wherein:

said first outer oxide layer is deposited using atomic layer deposition; and said second outer oxide layer is deposited using atomic layer deposition.

18. A method according to claim 16, further comprising:

creating an additional oxide sidewall layer outside of said nitride sidewall layer.

19. A method according to claim 16, wherein:

said control gate and said second dielectric region wrap around said floating gate.

20. A method for fabricating non-volatile storage, comprising:

creating a first conductive gate layer, said first conductive layer is a polysilicon floating gate;

creating an ONO layer using atomic layer deposition for at least part of said ONO layer, said ONO layer includes a first oxide layer, a nitride layer and a second oxide layer, said first oxide layer, said nitride layer and said second oxide layer have relative thicknesses of approximately 5:2:5;

creating a second conductive layer, said ONO layer is between said first conductive layer and said second conductive layer;

forming source/drain regions; and creating a sidewall for said first conductive layer and said ONO layer, said sidewall includes at least a third oxide layer and a second nitride layer, said creating said sidewall is completed after completing said forming source/drain regions, said creating said sidewall includes depositing said third oxide layer, annealing after depositing said third oxide layer, and depositing said second nitride layer after said annealing.

21. A method according to claim 20, wherein:

said second conductive layer is a polysilicon control gate.

22. A method according to claim 20, wherein:

said source/drain regions are formed prior to creating said third oxide layer.

23. A method according to claim 20, wherein:

said creating said sidewall includes adding an additional oxide layer to said sidewall.

24. A method for fabricating non-volatile storage, comprising:

adding a first dielectric region on a substrate;

creating a conductive floating gate adjacent said first dielectric region;

creating a second dielectric region adjacent said floating gate, said creating said second dielectric region includes creating a first layer using atomic layer deposition, said first layer includes oxide, creating a second layer, and creating a third layer using atomic layer deposition, said third layer includes oxide, said second layer is between said first layer and said third layer, said second layer is thinner than said first layer and thinner than said third layer, the thickness of the second layer is approximately 40% the thickness of the first layer and is approximately 40% the thickness of the third layer;

creating a control gate adjacent said second dielectric region;

forming source/drain regions in said substrate;

creating an oxide sidewall layer for said floating gate and said second dielectric region using atomic layer deposition after forming said source/drain regions; and creating a nitride sidewall layer for said floating gate and said second dielectric region using atomic layer deposition after forming said source/drain regions.

25. A method according to claim 24, wherein:

said second layer includes nitride.

26. A method according to claim 24, wherein:

said first layer includes SiON;

said second layer includes HfSiON; and said third layer includes SiON.

27. A method according to claim 24, wherein:

said first layer includes SiON;

said second layer includes AlON; and said third layer includes SiON.

28. A method according to claim 24, wherein:

said first layer includes oxide;

said second layer includes aluminum oxide; and said third layer includes oxide.

29. A method according to claim 24, wherein:

said first layer includes oxide;

said second layer includes HfSiON; and said third layer includes oxide.

* * * * *